(12) United States Patent
Parthasarathy et al.

(10) Patent No.: US 8,653,583 B2
(45) Date of Patent: Feb. 18, 2014

(54) SENSING FET INTEGRATED WITH A HIGH-VOLTAGE TRANSISTOR

(75) Inventors: Vijay Parthasarathy, Palo Alto, CA (US); Sujit Banerjee, Campbell, CA (US); Martin H. Manley, Saratoga, CA (US)

(73) Assignee: Power Integrations, Inc., San Jose, CA (US)

( * ) Notice: Subject to any disclaimer, the term of this patent is extended or adjusted under 35 U.S.C. 154(b) by 1295 days.

(21) Appl. No.: 11/707,586

(22) Filed: Feb. 16, 2007

(65) Prior Publication Data
US 2008/0197406 A1 Aug. 21, 2008

(51) Int. Cl.
*H01L 29/76* (2006.01)

(52) U.S. Cl.
USPC ................ 257/328; 257/329; 257/330

(58) Field of Classification Search
USPC .................................. 257/328, 329
See application file for complete search history.

(56) References Cited

U.S. PATENT DOCUMENTS

| | | | |
|---|---|---|---|
| 4,343,015 A | 8/1982 | Baliga et al. | |
| 4,531,173 A | 7/1985 | Yamada | |
| 4,553,084 A * | 11/1985 | Wrathall | 323/316 |
| 4,618,541 A | 10/1986 | Forouhi et al. | |
| 4,626,789 A | 12/1986 | Nakata et al. | |
| 4,626,879 A | 12/1986 | Colak | |
| 4,665,426 A | 5/1987 | Allen et al. | |
| 4,738,936 A | 4/1988 | Rice | |
| 4,754,310 A | 6/1988 | Coe | |
| 4,764,800 A | 8/1988 | Sander | |
| 4,769,685 A | 9/1988 | MacIver et al. | |
| 4,796,070 A | 1/1989 | Black | |
| 4,811,075 A | 3/1989 | Eklund | |
| 4,890,144 A | 12/1989 | Teng et al. | |
| 4,890,146 A | 12/1989 | Williams et al. | |
| 4,908,682 A * | 3/1990 | Takahashi | 257/336 |
| 4,922,327 A | 5/1990 | Mena et al. | |
| 4,926,074 A | 5/1990 | Singer et al. | |
| 4,926,243 A | 5/1990 | Nakagawa et al. | |
| 4,929,987 A | 5/1990 | Einthoven | |
| 4,939,566 A | 7/1990 | Singer et al. | |
| 4,951,102 A * | 8/1990 | Beitman et al. | 257/329 |
| 4,963,951 A | 10/1990 | Adler et al. | |
| 4,967,246 A | 10/1990 | Tanaka | |

(Continued)

FOREIGN PATENT DOCUMENTS

| | | |
|---|---|---|
| CN | 1469487 | 1/2004 |
| DE | 4309764 | 9/1994 |

(Continued)

*Primary Examiner* — Samuel Gebremariam
(74) *Attorney, Agent, or Firm* — The Law Office of Bradley J. Bereznak

(57) ABSTRACT

In one embodiment, a semiconductor device includes a main vertical field-effect transistor (FET) and a sensing FET. The main vertical FET and the sense FET are both formed on a pillar of semiconductor material. Both share an extended drain region formed in the pillar above the substrate, and first and second gate members formed in a dielectric on opposite sides of the pillar. The source regions of the main vertical FET and the sensing FET are separated and electrically isolated in a first lateral direction. In operation, the sensing FET samples a small portion of a current that flows in the main vertical FET. It is emphasized that this abstract is provided to comply with the rules requiring an abstract that will allow a searcher or other reader to quickly ascertain the subject matter of the technical disclosure.

10 Claims, 14 Drawing Sheets

(56) References Cited

U.S. PATENT DOCUMENTS

| | | |
|---|---|---|
| 5,008,794 A | 4/1991 | Leman |
| 5,010,024 A | 4/1991 | Allen et al. |
| 5,025,296 A | 6/1991 | Fullerton et al. |
| 5,040,045 A | 8/1991 | McArthur et al. |
| 5,068,700 A | 11/1991 | Yamaguchi et al. |
| 5,072,266 A | 12/1991 | Belucua et al. |
| 5,072,268 A | 12/1991 | Rumennik et al. |
| 5,122,848 A | 6/1992 | Lee et al. |
| 5,146,298 A | 9/1992 | Eklund |
| 5,155,574 A | 10/1992 | Yamaguchi |
| 5,164,891 A | 11/1992 | Keller |
| 5,237,193 A | 8/1993 | Williams et al. |
| 5,258,636 A | 11/1993 | Rumennik et al. |
| 5,270,264 A | 12/1993 | Andideh et al. |
| 5,274,259 A | 12/1993 | Grabowski et al. |
| 5,285,367 A | 2/1994 | Keller |
| 5,294,824 A | 3/1994 | Okada |
| 5,306,656 A | 4/1994 | Williams et al. |
| 5,313,082 A | 5/1994 | Eklund |
| 5,323,044 A | 6/1994 | Rumennik et al. |
| 5,324,683 A | 6/1994 | Fitch et al. |
| 5,326,711 A | 7/1994 | Malhi |
| 5,349,225 A | 9/1994 | Redwine et al. |
| 5,359,221 A | 10/1994 | Miyamoto et al. |
| 5,386,136 A | 1/1995 | Williams et al. |
| 5,408,141 A * | 4/1995 | Devore et al. .................. 327/541 |
| 5,411,901 A | 5/1995 | Grabowski et al. |
| 5,438,215 A | 8/1995 | Tihanyi |
| 5,473,180 A | 12/1995 | Ludikhuize |
| 5,514,608 A | 5/1996 | Williams et al. |
| 5,521,105 A | 5/1996 | Hsu et al. |
| 5,550,405 A | 8/1996 | Cheung et al. |
| 5,637,898 A | 6/1997 | Baliga |
| 5,648,283 A | 7/1997 | Tsang et al. |
| 5,654,206 A | 8/1997 | Merrill |
| 5,656,543 A | 8/1997 | Chung |
| 5,659,201 A | 8/1997 | Wollensen |
| 5,663,599 A | 9/1997 | Lur |
| 5,665,994 A | 9/1997 | Palara |
| 5,670,828 A | 9/1997 | Cheung et al. |
| 5,679,608 A | 10/1997 | Cheung et al. |
| 5,716,887 A | 2/1998 | Kim |
| 5,760,440 A | 6/1998 | Kitamura et al. |
| 5,821,144 A | 10/1998 | D'Anna et al. |
| 5,821,580 A | 10/1998 | Kuwahara |
| 5,869,875 A | 2/1999 | Hebert |
| 5,917,216 A | 6/1999 | Floyd et al. |
| 5,929,481 A | 7/1999 | Hshieh et al. |
| 5,943,595 A | 8/1999 | Akiyama et al. |
| 5,969,408 A | 10/1999 | Perelli |
| 5,973,360 A | 10/1999 | Tihanyi |
| 5,998,833 A | 12/1999 | Baliga |
| 6,010,926 A | 1/2000 | Rho et al. |
| 6,049,108 A | 4/2000 | Williams et al. |
| 6,054,752 A | 4/2000 | Hara et al. |
| 6,084,277 A | 7/2000 | Disney et al. |
| 6,127,703 A | 10/2000 | Letavic et al. |
| 6,133,607 A | 10/2000 | Funaki et al. |
| 6,168,983 B1 | 1/2001 | Rumennik et al. |
| 6,184,555 B1 | 2/2001 | Tihanyi et al. |
| 6,191,447 B1 | 2/2001 | Baliga |
| 6,194,283 B1 | 2/2001 | Gardner et al. |
| 6,207,994 B1 | 3/2001 | Rumennik et al. |
| 6,251,716 B1 | 6/2001 | Yu |
| 6,281,705 B1 | 8/2001 | Yu |
| 6,294,818 B1 | 9/2001 | Fujihira |
| 6,304,007 B1 | 10/2001 | Yu |
| 6,307,223 B1 | 10/2001 | Yu |
| 6,316,807 B1 | 11/2001 | Fujishima et al. |
| 6,349,047 B1 | 2/2002 | Yu |
| 6,353,252 B1 | 3/2002 | Yasuhara et al. |
| 6,355,513 B1 | 3/2002 | Yu |
| 6,356,059 B1 | 3/2002 | Yu |
| 6,359,308 B1 | 3/2002 | Hijzen et al. |
| 6,362,064 B2 | 3/2002 | McGregor et al. |
| 6,365,932 B1 | 4/2002 | Kouno et al. |
| 6,388,286 B1 | 5/2002 | Baliga |
| 6,404,009 B1 | 6/2002 | Mori et al. |
| 6,424,007 B1 | 7/2002 | Disney |
| 6,462,377 B2 | 10/2002 | Hurky et al. |
| 6,465,291 B1 | 10/2002 | Disney |
| 6,468,847 B1 | 10/2002 | Disney |
| 6,486,011 B1 | 11/2002 | Yu |
| 6,489,190 B2 | 12/2002 | Disney |
| 6,501,130 B2 | 12/2002 | Disney |
| 6,504,209 B2 | 1/2003 | Disney |
| 6,509,220 B2 | 1/2003 | Disney |
| 6,525,372 B2 | 2/2003 | Baliga |
| 6,528,880 B1 | 3/2003 | Planey |
| 6,542,001 B1 | 4/2003 | Yu |
| 6,549,439 B1 | 4/2003 | Yu |
| 6,552,597 B1 | 4/2003 | Disney et al. |
| 6,555,873 B2 | 4/2003 | Disney et al. |
| 6,555,883 B1 | 4/2003 | Disney et al. |
| 6,563,171 B2 | 5/2003 | Disney |
| 6,566,936 B1 | 5/2003 | Yu |
| 6,570,219 B1 | 5/2003 | Rumennik et al. |
| 6,573,558 B2 * | 6/2003 | Disney .......................... 257/328 |
| 6,580,252 B1 | 6/2003 | Yu |
| 6,583,663 B1 | 6/2003 | Disney et al. |
| 6,614,289 B1 | 9/2003 | Yu |
| 6,621,722 B1 | 9/2003 | Yu |
| 6,633,065 B2 | 10/2003 | Rumennik et al. |
| 6,635,544 B2 | 10/2003 | Disney |
| 6,639,277 B2 | 10/2003 | Rumennik et al. |
| 6,661,276 B1 | 12/2003 | Chang |
| 6,667,213 B2 | 12/2003 | Disney |
| 6,674,107 B1 | 1/2004 | Yu |
| 6,677,641 B2 | 1/2004 | Kocon |
| 6,680,646 B2 | 1/2004 | Disney |
| 6,683,344 B2 | 1/2004 | Tsukanov et al. |
| 6,683,346 B2 | 1/2004 | Zeng |
| 6,696,706 B1 | 2/2004 | Pegler |
| 6,724,041 B2 | 4/2004 | Rumennik et al. |
| 6,730,585 B2 | 5/2004 | Disney |
| 6,734,714 B2 | 5/2004 | Disney |
| 6,734,715 B1 | 5/2004 | Yu |
| 6,747,342 B1 | 6/2004 | Planey |
| 6,750,105 B2 | 6/2004 | Disney et al. |
| 6,750,698 B1 | 6/2004 | Yu |
| 6,759,289 B2 | 7/2004 | Disney |
| 6,764,889 B2 | 7/2004 | Baliga |
| 6,768,171 B2 | 7/2004 | Disney |
| 6,768,172 B2 | 7/2004 | Rumennik et al. |
| 6,774,417 B1 | 8/2004 | Lin et al. |
| 6,777,722 B1 | 8/2004 | Yu et al. |
| 6,777,749 B2 | 8/2004 | Rumennik et al. |
| 6,781,194 B2 | 8/2004 | Baliga |
| 6,781,198 B2 | 8/2004 | Disney |
| 6,787,437 B2 | 9/2004 | Rumennik et al. |
| 6,787,847 B2 | 9/2004 | Disney et al. |
| 6,787,848 B2 | 9/2004 | Ono et al. |
| 6,798,020 B2 | 9/2004 | Disney et al. |
| 6,800,903 B2 | 10/2004 | Rumennik et al. |
| 6,809,354 B2 | 10/2004 | Okada et al. |
| 6,812,079 B1 | 11/2004 | Pegler |
| 6,815,293 B2 | 11/2004 | Disney et al. |
| 6,818,490 B2 | 11/2004 | Disney |
| 6,825,536 B2 | 11/2004 | Disney |
| 6,828,631 B2 | 12/2004 | Rumennik et al. |
| 6,838,346 B2 | 1/2005 | Disney |
| 6,865,093 B2 | 3/2005 | Disney |
| 6,882,005 B2 | 4/2005 | Disney et al. |
| 6,887,768 B1 | 5/2005 | Yu |
| 6,900,506 B1 | 5/2005 | Yu |
| 6,921,932 B1 | 7/2005 | Yu et al. |
| 6,975,157 B1 | 12/2005 | Yu |
| 6,987,299 B2 | 1/2006 | Disney et al. |
| 6,995,052 B1 | 2/2006 | Yu et al. |
| 7,009,228 B1 | 3/2006 | Yu |
| 7,009,229 B1 | 3/2006 | Lin et al. |
| 7,038,260 B1 | 5/2006 | Yu |
| 7,045,397 B1 | 5/2006 | Yu et al. |
| 7,075,132 B1 | 7/2006 | Lin et al. |

(56) References Cited

U.S. PATENT DOCUMENTS

| | | |
|---|---|---|
| 7,098,634 B1 | 8/2006 | Yu |
| 7,115,958 B2 | 10/2006 | Disney et al. |
| 7,122,885 B2 | 10/2006 | Planey |
| 7,135,748 B2 | 11/2006 | Balakrishnan |
| 7,211,845 B1 | 5/2007 | Yu et al. |
| 7,220,629 B2 | 5/2007 | Balakrishnan |
| 7,220,661 B1 | 5/2007 | Yu et al. |
| 7,221,011 B2 | 5/2007 | Banerjee et al. |
| 7,227,242 B1 | 6/2007 | Lin et al. |
| 7,238,976 B1 | 7/2007 | Yu et al. |
| 7,253,042 B2 | 8/2007 | Disney et al. |
| 7,253,059 B2 | 8/2007 | Balakrishnan |
| 7,262,461 B1 | 8/2007 | Yu et al. |
| 7,265,398 B1 | 9/2007 | Yu |
| 7,268,378 B1 | 9/2007 | Yu et al. |
| 7,335,944 B2 | 2/2008 | Banerjee |
| 7,345,342 B2 * | 3/2008 | Challa et al. .................. 257/341 |
| 7,348,826 B1 | 3/2008 | Klein et al. |
| 7,381,618 B2 | 6/2008 | Disney |
| 7,391,088 B2 | 6/2008 | Balakrishnan |
| 7,417,266 B1 | 8/2008 | Li et al. |
| 7,452,763 B1 | 11/2008 | Yu |
| 7,459,366 B2 | 12/2008 | Banrjee et al. |
| 7,468,536 B2 | 12/2008 | Parthasarathy |
| 7,494,875 B2 | 2/2009 | Disney |
| 7,554,152 B1 * | 6/2009 | Ranucci et al. ............... 257/316 |
| 7,557,406 B2 | 7/2009 | Parthasarathy |
| 7,585,719 B2 | 9/2009 | Balakrishnan |
| 7,595,523 B2 | 9/2009 | Parthasarathy et al. |
| 7,608,888 B1 | 10/2009 | Li et al. |
| 7,648,879 B2 | 1/2010 | Banerjee et al. |
| 7,655,964 B1 | 2/2010 | Lin et al. |
| 7,696,540 B2 | 4/2010 | Francis et al. |
| 7,696,598 B2 | 4/2010 | Francis et al. |
| 7,732,860 B2 | 6/2010 | Parthasarathy et al. |
| 7,745,291 B2 | 6/2010 | Disney |
| 7,746,156 B1 | 6/2010 | Massie et al. |
| 7,786,533 B2 | 8/2010 | Disney |
| 7,791,132 B2 | 9/2010 | Banerjee et al. |
| 7,816,731 B2 | 10/2010 | Parthasarathy et al. |
| 7,829,944 B2 | 11/2010 | Disney |
| 7,859,037 B2 | 12/2010 | Parthasarathy et al. |
| 7,863,172 B2 | 1/2011 | Zhu |
| 7,871,882 B2 | 1/2011 | Parthasarathy |
| 7,875,962 B2 | 1/2011 | Balakrishnan |
| 7,893,754 B1 | 2/2011 | Kung |
| 7,932,738 B1 | 4/2011 | Banerjee et al. |
| 7,939,853 B2 | 5/2011 | Murphy et al. |
| 7,964,912 B2 | 6/2011 | Parthasarathy et al. |
| 7,998,817 B2 | 8/2011 | Disney |
| 7,999,606 B2 | 8/2011 | Kung et al. |
| 8,022,456 B2 | 9/2011 | Parthasarathy et al. |
| 2001/0015459 A1 | 8/2001 | Watanabe et al. |
| 2002/0056884 A1 | 5/2002 | Baliga |
| 2002/0175351 A1 | 11/2002 | Baliga |
| 2003/0209757 A1 | 11/2003 | Henninger et al. |
| 2005/0167742 A1 | 8/2005 | Challa et al. |
| 2005/0167749 A1 | 8/2005 | Disney |
| 2005/0218963 A1 * | 10/2005 | Ball et al. ....................... 327/427 |
| 2008/0197396 A1 | 8/2008 | Parthasarathy |
| 2008/0197397 A1 | 8/2008 | Parthasarathy et al. |
| 2008/0197406 A1 | 8/2008 | Parthasarathy et al. |

FOREIGN PATENT DOCUMENTS

| | | |
|---|---|---|
| EP | 0 962 987 | 12/1999 |
| EP | 0 987 766 | 3/2000 |
| EP | 1073123 | 1/2001 |
| EP | 1689 001 | 8/2006 |
| GB | 2309336 | 1/1997 |
| JP | 56038867 | 4/1981 |
| JP | 57010975 | 1/1982 |
| JP | 57012557 | 1/1982 |
| JP | 57012558 | 1/1982 |
| JP | 60064471 | 4/1985 |
| JP | 1238037 | 9/1989 |
| JP | 3211771 | 9/1991 |
| JP | 4107877 | 4/1992 |
| JP | 4107867 | 7/1992 |
| JP | 6120510 | 4/1994 |
| JP | 6196630 | 6/1994 |
| JP | 6224426 | 8/1994 |
| JP | 9266311 | 10/1997 |
| JP | 10 107282 | 4/1998 |
| JP | 10256545 | 9/1998 |
| JP | 11-233765 | 8/1999 |
| JP | 11233765 | 8/1999 |
| JP | 2000012854 | 1/2000 |
| JP | 2002043562 | 2/2002 |
| JP | 2004-079955 | 3/2004 |
| JP | 2004079955 | 3/2004 |
| WO | 9735346 | 9/1997 |
| WO | 9934449 | 7/1999 |
| WO | 0033385 | 6/2000 |
| WO | 0241402 | 5/2002 |
| WO | 02099909 | 12/2002 |

* cited by examiner

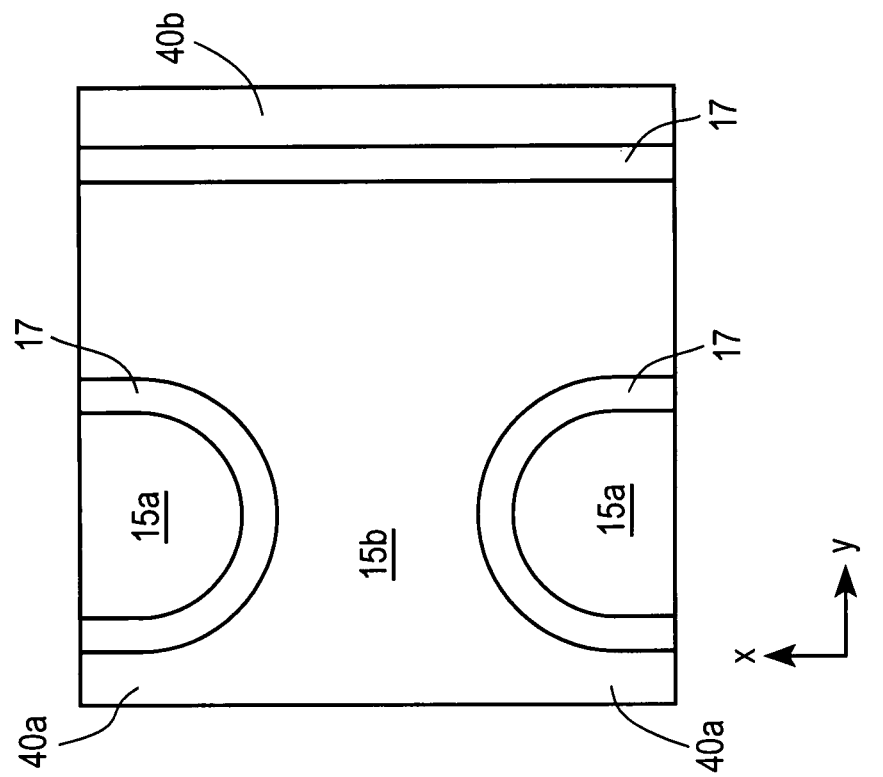
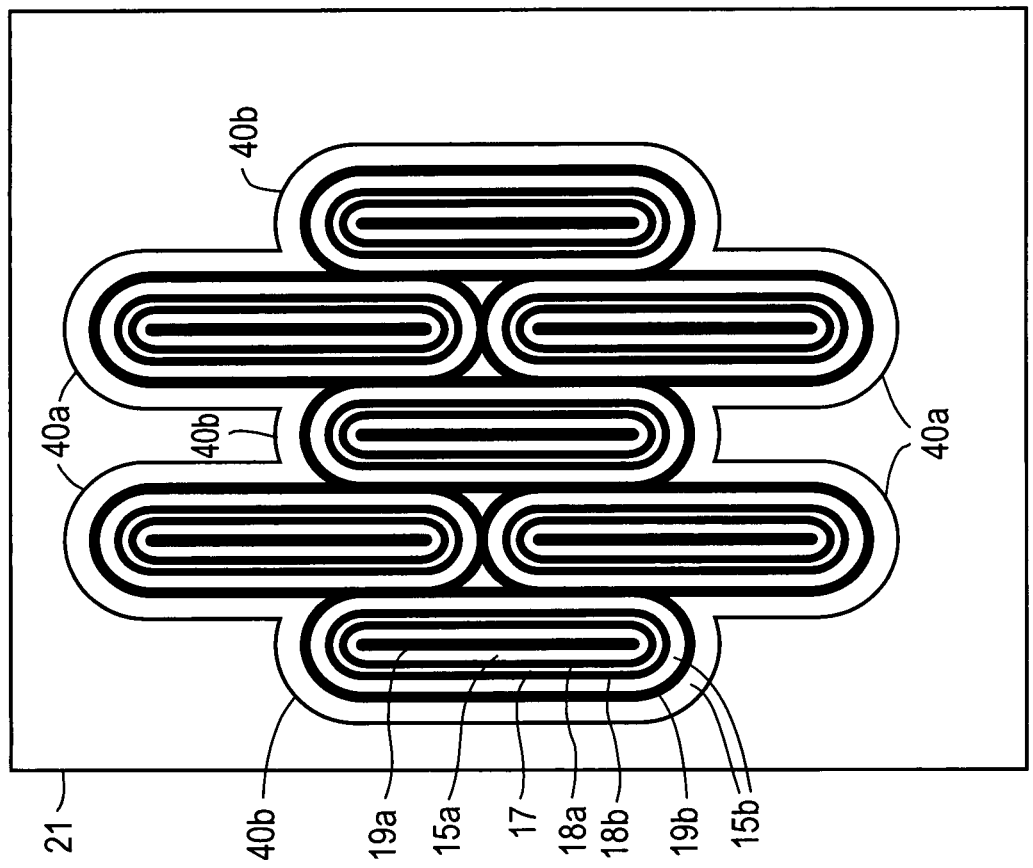
FIG. 4A
FIG. 4B

SENSING FET INTEGRATED WITH A HIGH-VOLTAGE TRANSISTOR

TECHNICAL FIELD

The present disclosure relates to semiconductor devices, device structures, and processes for fabricating high-voltage or power transistor devices.

BACKGROUND

Current sensing field-effect transistors, commonly referred to as sensefets, have been used widely used for many years in applications where accurate current sensing can provide information for both control and over-current protection. Sensefets are typically constructed as a small part or transistor section of a larger, main current carrying semiconductor device. For example, in a conventional insulated-gate field-effect transistor (MOSFET) device, the sensefet may comprise a small section of the channel region of the main device. In operation, the sensefet may sample a small portion of the channel current of the larger device, thereby providing an indication of the current flowing through the main transistor device. The sensefet and main device typically share a common drain and gate, but each has a separate source electrode.

High-voltage, field-effect transistors (HVFETs) are also well known in the semiconductor arts. Many HVFETs (i.e., power transistors) employ a device structure that includes an extended drain or drift region that supports or blocks the applied high-voltage (e.g., several hundred volts) when the device is in the "off" state. In a prior art vertical HVFET structure, a mesa or pillar of semiconductor material forms the extended drain or drift region for current flow in the on-state. A trench gate structure is formed near the top of the substrate, adjacent the sidewall regions of the mesa where a body region is disposed above the extended drain region. Application of an appropriate voltage potential to the gate causes a conductive channel to be formed along the vertical sidewall portion of the body region such that current may flow vertically through the semiconductor material, i.e., from a top surface of the substrate where the source region is disposed, down to the bottom of the substrate where the drain region is located.

One problem that exists is that prior art sensefets designed for use with conventional MOSFETs are generally inapplicable for use with vertical power transistor structures due to the deep trench that forms the pillar isolating both the channel and drift regions.

BRIEF DESCRIPTION OF THE DRAWINGS

The present disclosure will be understood more fully from the detailed description that follows and from the accompanying drawings, which however, should not be taken to limit the invention to the specific embodiments shown, but are for explanation and understanding only.

FIG. 4A illustrates yet another example layout of the vertical HVFET structure shown in FIG. 1.

FIG. 4B is an expanded view of one portion of the example layout shown in FIG. 4A.

DETAILED DESCRIPTION

In the following description specific details are set forth, such as material types, dimensions, structural features, processing steps, etc., in order to provide a thorough understanding of the present invention. However, persons having ordinary skill in the relevant arts will appreciate that these specific details may not be needed to practice the present invention. It should also be understood that the elements in the figures are representational, and are not drawn to scale in the interest of clarity.

Figure 1:
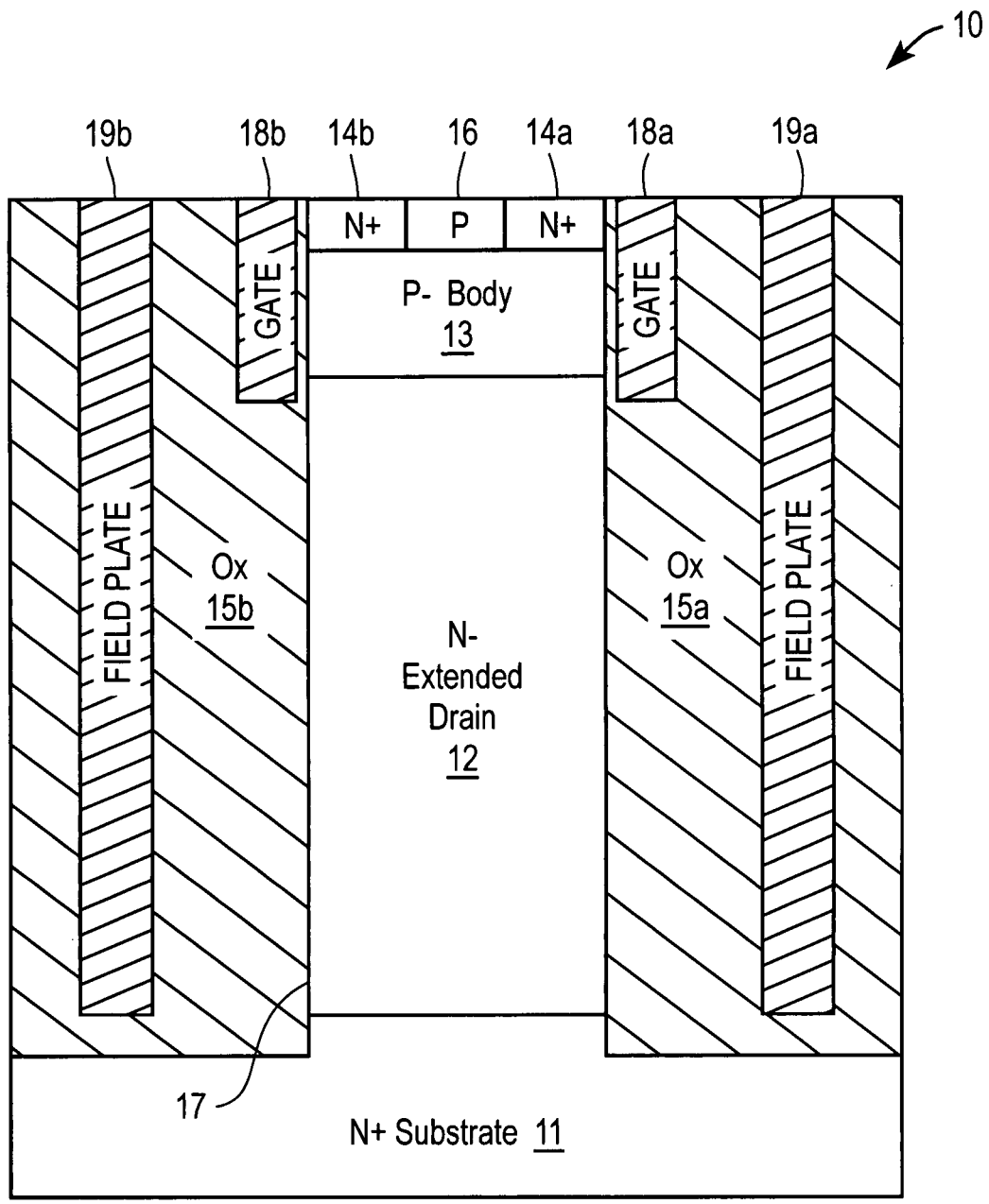
FIG. 1 illustrates an example cross-sectional side view of a vertical HVFET structure.

FIG. 1 illustrates an example cross-sectional side view of a vertical HVFET 10 having a structure that includes an extended drain region 12 of N-type silicon formed on an N+ doped silicon substrate 11. Substrate 11 is heavily doped to minimize its resistance to current flowing through to the drain electrode, which is located on the bottom of the substrate in the completed device. In one embodiment, extended drain region 12 is part of an epitaxial layer that extends from substrate 11 to a top surface of the silicon wafer. A P-type body region 13 and N+ doped source regions 14a & 14b laterally separated by a P-type region 16, are formed near a top surface of the epitaxial layer. As can be seen, P-type body region 13 is disposed above and vertically separates extended drain region 12 from N+ source regions 14a & 14b and P-type region 16.

In one embodiment, the doping concentration of the portion of epitaxial layer which comprises extended drain region 12 is linearly graded to produce an extended drain region that exhibits a substantially uniform electric-field distribution. Linear grading may stop at some point below the top surface of the epitaxial layer 12.

Extended drain region 12, body region 13, source regions 14a & 14b and P-type region 16 collectively comprise a mesa or pillar 17 (both terms are used synonymously in the present application) of silicon material in the example vertical transistor of FIG. 1. Vertical trenches formed on opposite sides of pillar 17 are filled with a layer of dielectric material (e.g., oxide) that makes up dielectric region 15. The height and width of pillar 17, as well as the spacing between adjacent vertical trenches may be determined by the breakdown voltage requirements of the device. In various embodiments, mesa 17 has a vertical height (thickness) in a range of about 30 µm to 120 µm thick. For example, a HVFET formed on a die approximately 1 mm×1 mm in size may have a pillar 17 with a vertical thickness of about 60 µm. By way of further example, a transistor structure formed on a die of about 2 mm-4 mm on each side may have a pillar structure of approximately 30 µm thick. In certain embodiments, the lateral width of pillar 17 is as narrow as can be reliably manufactured (e.g., about 0.4 µm to 0.8 µm wide) in order to achieve a very high breakdown voltage (e.g., 600-800V).

Figure 12A:
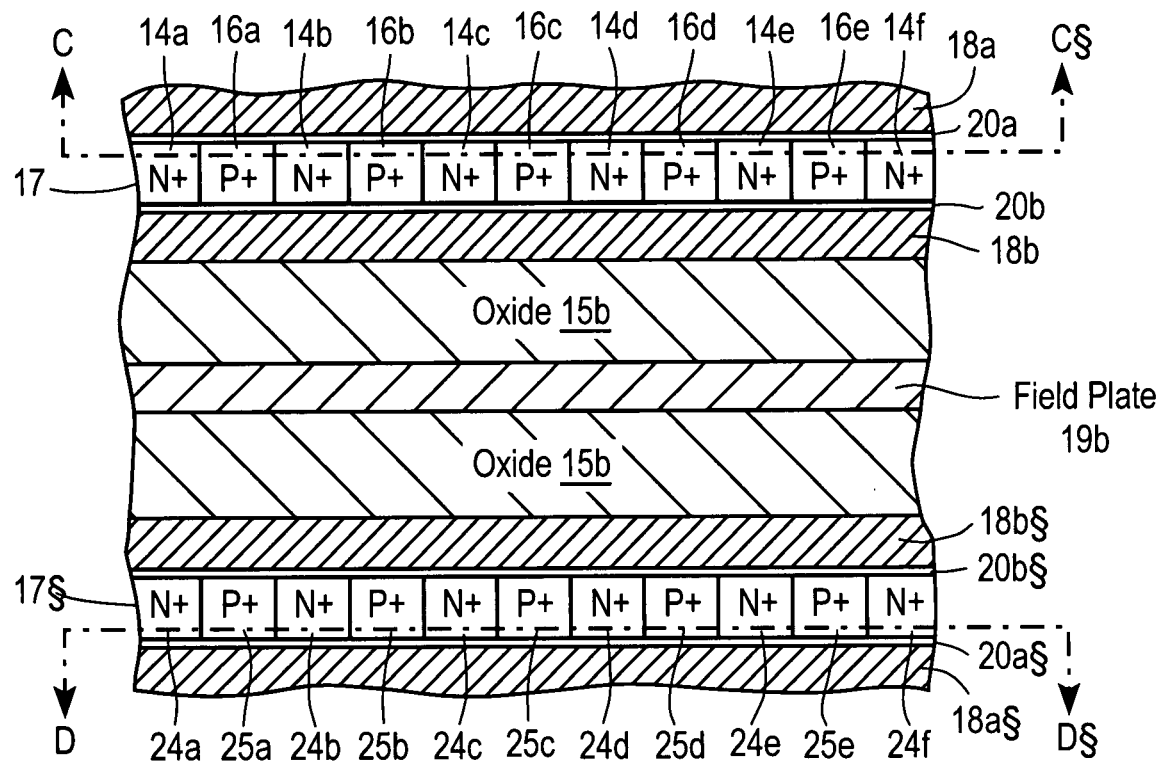
FIG. 12A is a top view of a portion of yet another example layout of a sensefet incorporated in the vertical HVFET structure shown in FIG. 1.
Figure 12B:
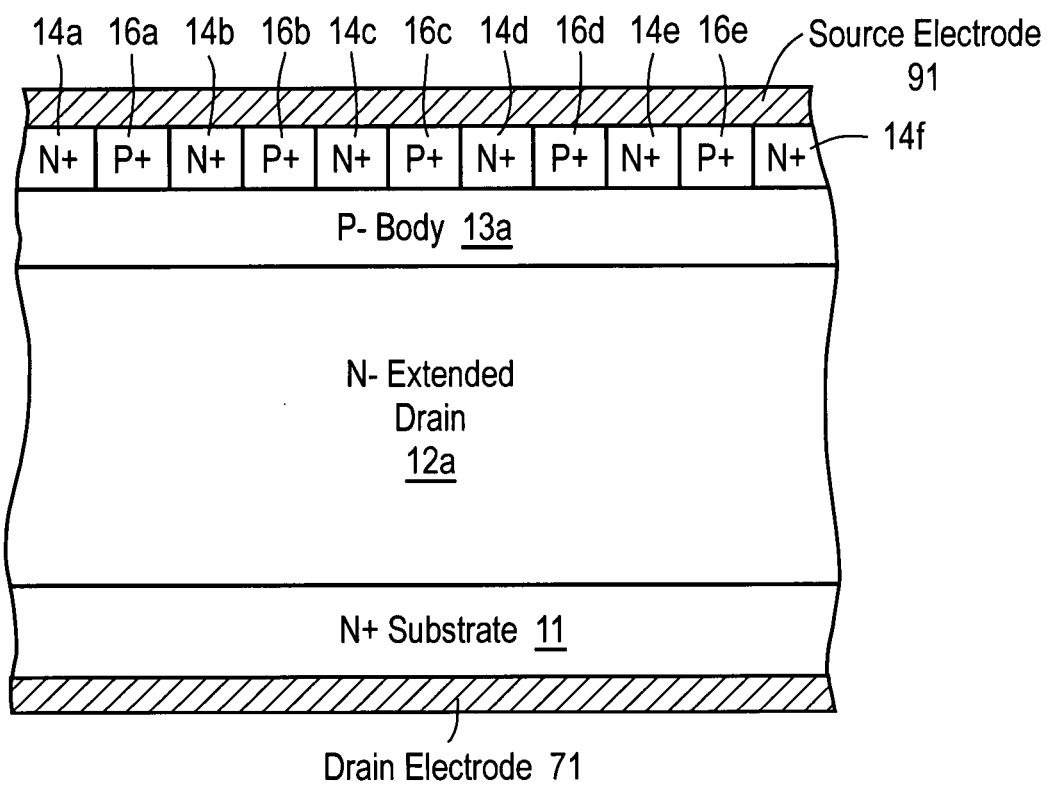
FIG. 12B is a cross-sectional side view taken through cut lines C-C' of the device structure shown in FIG. 12A.

In another embodiment, instead of arranging P-type region 16 between N+ source regions 14a & 14b across the lateral width of pillar 17 (as shown in FIG. 1), N+ source regions and P-type regions may be alternately formed at the top of pillar 17 across the lateral length of pillar 17. In other words, a given cross-sectional view such as that shown in FIG. 1 would have either an N+ source region 14, or a P-type region 16, that extends across the full lateral width of pillar 17, depending upon where the cross-section is taken. In such an embodiment, each N+ source region 14 is adjoined on both sides (along the lateral length of the pillar) by P-type regions 16. Similarly, each P-type region 16 is adjoined on both sides (along the lateral length of the pillar) by N+ source regions 14. (An example of such an embodiment is shown in FIGS. 12A & 12B, discussed below).

Dielectric regions 15a & 15b may comprise silicon dioxide, silicon nitride, or other suitable dielectric materials. Dielectric regions 15 may be formed using a variety of well-known methods, including thermal growth and chemical vapor deposition. Disposed within each of the dielectric layers 15, and fully insulated from substrate 11 and pillar 17, is a field plate 19. The conductive material used to from field plates 19 may comprise a heavily doped polysilicon, a metal (or metal alloys), a silicide, or other suitable materials. In the completed device structure, field plates 19a & 19b normally function as capacitive plates that may be used to deplete the extended drain region of charge when the HVFET is in the off state (i.e., when the drain is raised to a high voltage potential). In one embodiment, the lateral thickness of oxide region 15 that separates each field plate 19 from the sidewall of pillar 17 is approximately 4 µm.

The trench gate structure of vertical HVFET transistor 80 comprises gate members 18a & 18b, each respectively disposed in oxide regions 15a & 15b on opposite sides of pillar 17 between field plates 19a & 19b and body region 13. A high-quality, thin (e.g., ~500 Å) gate oxide layer separates gate members 18 from the sidewalls of pillar 17 adjacent body region 13. Gate members 18 may comprise polysilicon, or some other suitable material. In one embodiment, each gate member 18 has a lateral width of approximately 1.5 µm and a depth of about 3.5 µm.

Practitioners in the art will appreciate that N+ source regions 14 and P-type body region 13 near the top of pillar 17 may each be formed using ordinary deposition, diffusion, and/or implantation processing techniques. After formation of the N+ source region 38, HVFET 10 may be completed by forming source, drain, gate, and field plate electrodes that electrically connect to the respective regions/materials of the device using conventional fabrication methods (not shown in the figures for clarity reasons).

Figure 2B:
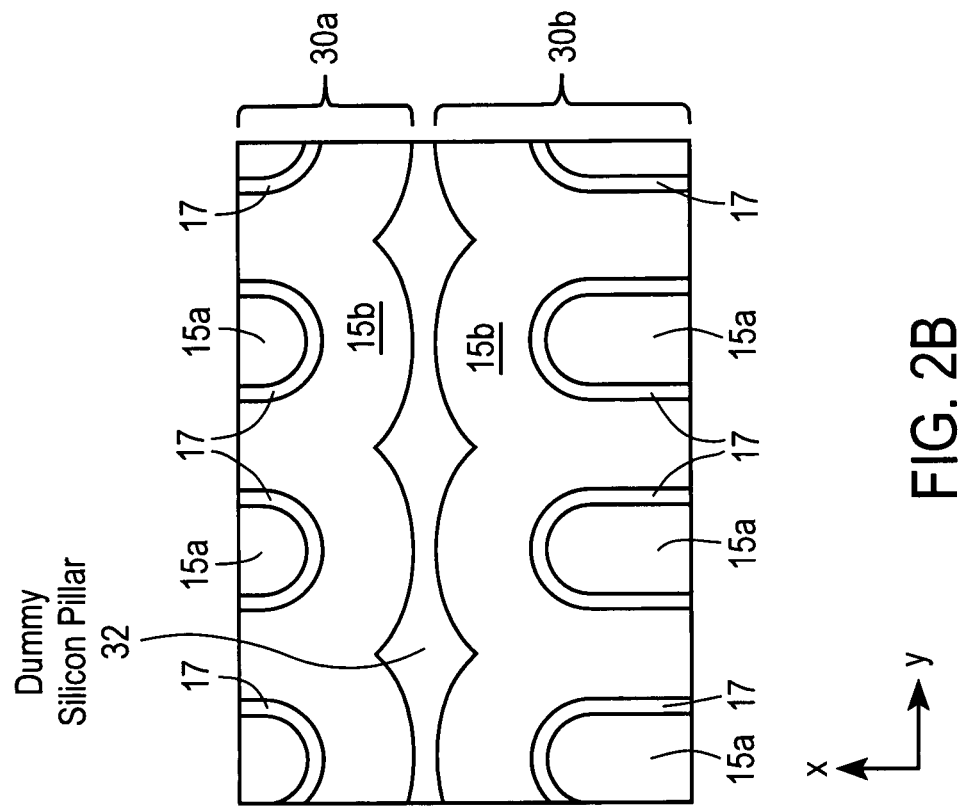
FIG. 2B is an expanded view of one portion of the example layout shown in FIG. 2A.
Figure 2A:
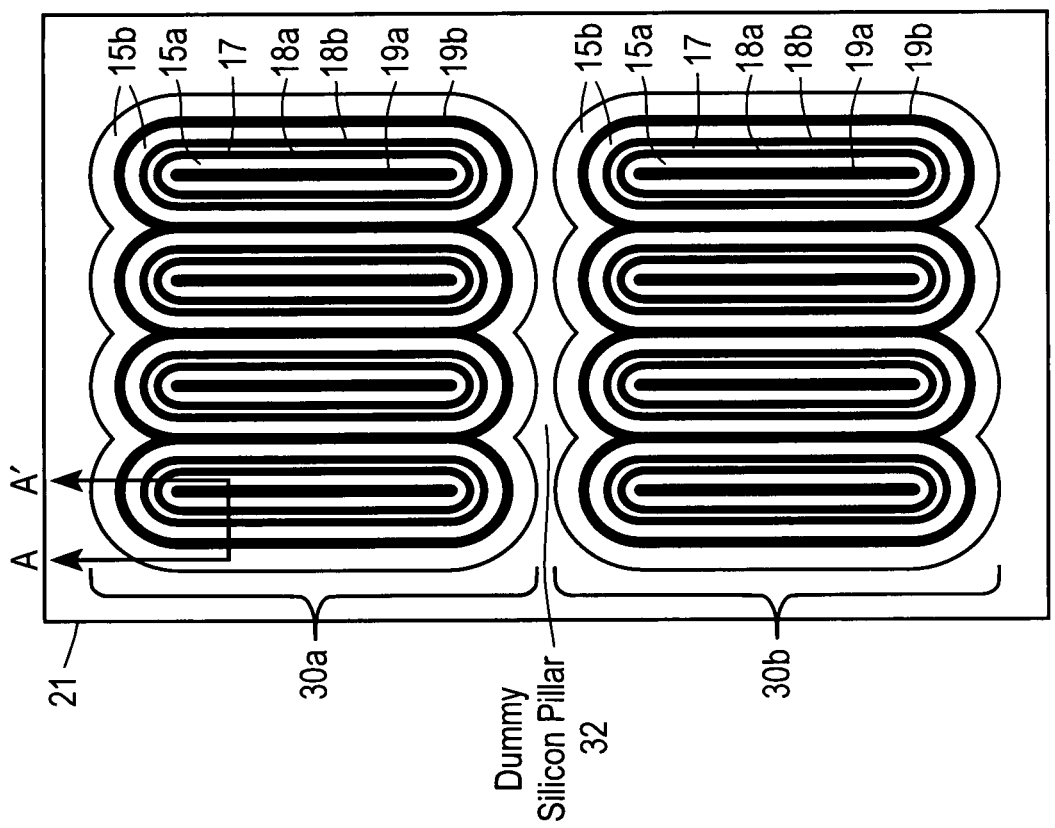
FIG. 2A illustrates an example layout of the vertical HVFET structure shown in FIG. 1.

FIG. 2A illustrates an example layout of the vertical HVFET structure shown in FIG. 1. The top view of FIG. 2A shows a single, discrete HVFET comprising an upper transistor section 30a and a lower transistor section 30b on a semiconductor die 21. The two sections are separated by a dummy silicon pillar 32. Each section 30 comprises a plurality of "racetrack" shaped transistor structures or segments, each transistor segment comprises an elongated ring or oval that includes a silicon pillar 17 surrounded on opposite sides by dielectric regions 15a & 15b. Pillar 17, itself, extends laterally in the x and y directions to form a continuous, elongated, racetrack-shaped ring or oval. Disposed within dielectric regions 15a & 15b are respective gate members 18a & 18b and field plates 19a & 19b. Field plate 19a comprises a single elongated member that terminates on either end in a rounded fingertip area. Field plate 19b, on the other hand, comprises an enlarged ring or oval that encircles pillar 17. Field plates 19b of adjacent racetrack structures are shown merged such that they share a common member on a side. By way of reference, the cross-sectional view of FIG. 1 may be taken through cut lines A-A' of the example layout of FIG. 2A.

It should be understood that in the example of FIG. 2A, each of the racetrack transistor segments has a width (i.e., pitch) in the y-direction of approximately 13 µm, a length in the x-direction in a range of about 400 µm to 1000 µm, with a pillar height of about 60 µm. In other words, the length to width ratio of the individual racetrack transistor segments comprising sections 30a & 30b is in a range of about 30 up to 80. In one embodiment, the length of each racetrack shaped segment is at least 20 times greater than its pitch or width.

Practitioners in the art will appreciate that in the completed device structure, patterned metal layers are used to interconnect each of the silicon pillars 17 of the individual transistor segments. That is, in a practical embodiment, all of the source regions, gate members, and field plates are respectively wired together to corresponding electrodes on the die. In the embodiment shown, the transistor segments in each section 30 are arranged in a side-by-side relationship in the y-direction substantially across a width of die 21. Similarly, in the x-direction the additive length of the transistor segments of sections 30a & 30b extend substantially over the length of die 21. In the example layout of FIG. 2A the width of dielectric regions 15 separating the silicon pillars, as well as the width of the field plates, is substantially uniform across semiconductor die 21. Laying out the transistor segments with uniform widths and separation distances prevents the formation of voids or holes following the processing steps used to conformably deposit the layers that comprise dielectric regions 15 and field plates 19.

FIG. 2B is an expanded view of one portion of the example layout shown in FIG. 2A. For purposes of clarity, only pillars 17 and dielectric regions 15b of each of the transistor segments is represented. Dummy silicon pillar 32 is shown separating the rounded end areas of dielectric regions 15b of respective transistor segment sections 30a & 30b. In other words, the deep vertical trenches that are etched in the semiconductor substrate to define pillars 17 also define dummy silicon pillar 32. In one embodiment, dummy silicon pillar 32 is made to have a width in the x-direction (i.e., that separates the transistor segment sections) that is as small as can be reliably manufactured.

The purpose of segmenting the single die HVFET into sections separated by dummy silicon pillar 32 is to introduce lengthwise (x-direction) stress-relief in the elongated racetrack shaped transistor segments. Segmenting or breaking the transistor device structures into two or more sections relieves mechanical stress across the length of the die. This stress is induced by the oxide regions flanking the pillars and normally concentrates at the rounded ends of each racetrack segment. Relieving mechanical stress by segmenting the transistor device structures into two or more sections thus prevents undesirable warping of the silicon pillars and damage (e.g., dislocations) to the silicon caused by stress.

It is appreciated that a tradeoff exists between the stress relief provided by a highly segmented layout and loss of conduction area. More segmentation results in greater stress relief, but at the expense of conduction area. In general, the greater the vertical height of the pillars and the larger the semiconductor die, the greater the number of transistor sections or segments that will be required. In one embodiment, for a 2 mm×2 mm die with 60 μm high pillars, adequate stress relief is provided in a HVFET with an on-resistance of about 1 ohm utilizing a layout comprising four racetrack transistor sections separated by dummy silicon pillars, each having a pitch (y-direction) of about 13 μm and a length (x-direction) of about 450 μm.

In another embodiment, instead of a dummy pillar of silicon to separate pairs of racetrack transistor segments, each pair being located in a different section, a dummy pillar comprising a different material may be utilized. The material used for the dummy pillar should have a thermal coefficient of expansion close to that of silicon, or sufficiently different from that of the dielectric region so as to relieve the lengthwise stress induced by the dielectric regions flanking the silicon pillars.

Figure 3B:
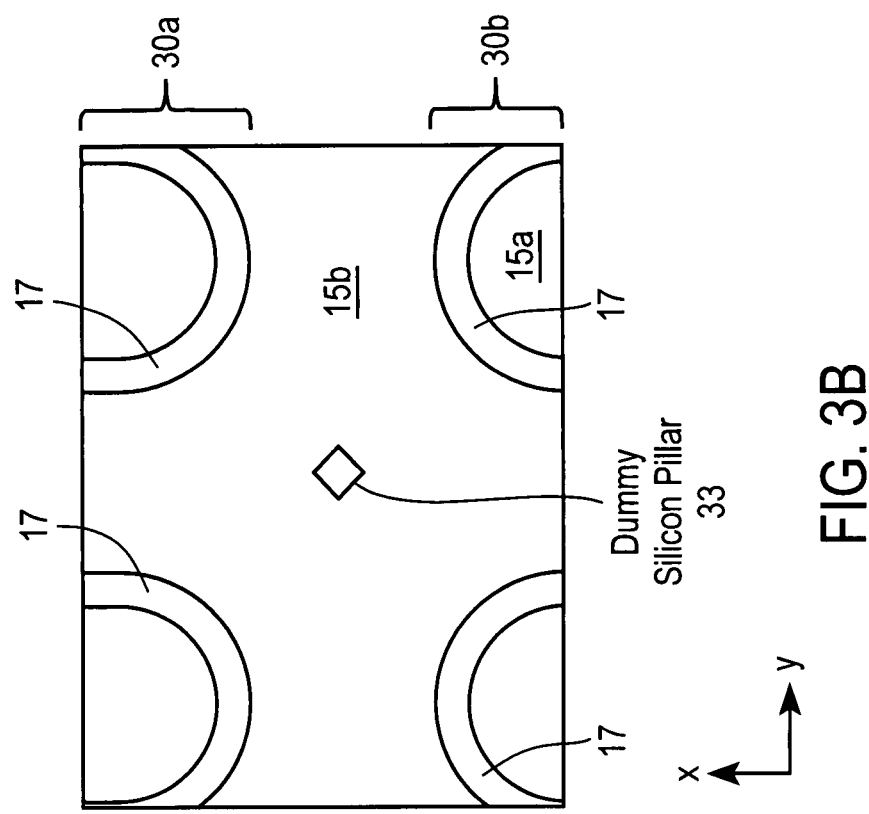
FIG. 3B is an expanded view of one portion of the example layout shown in FIG. 3A.
Figure 3A:
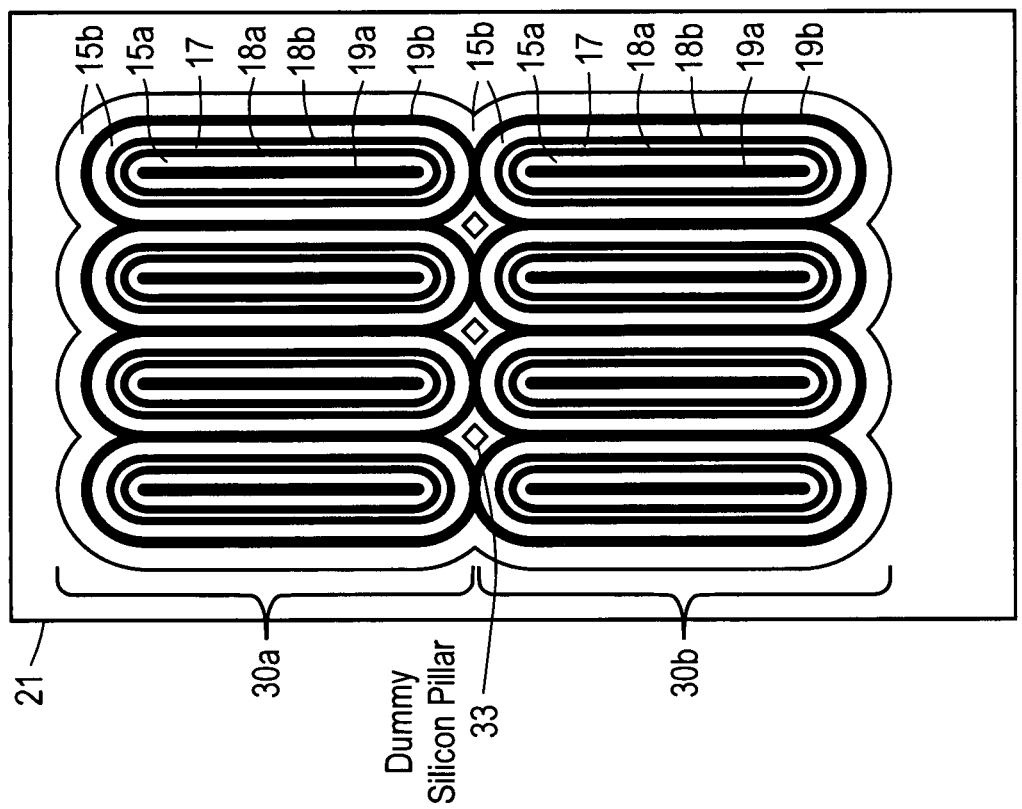
FIG. 3A illustrates another example layout of the vertical HVFET structure shown in FIG. 1.

FIG. 3A illustrates another example layout of the vertical HVFET structure shown in FIG. 1. FIG. 3B is an expanded view of one portion of the example layout shown in FIG. 3A, just showing pillars 17, oxide region 15b, and an optional dummy silicon pillar 33. Similar to the embodiment of FIGS. 2A & 2B, FIGS. 3A & 3B show a single, discrete HVFET comprising an upper transistor section 30a and a lower transistor section 30b on a semiconductor die 21. But in the example of FIGS. 3A & 3B, the deep vertical trenches filled with oxide regions 15b and field plates 19b of transistor sections 30a and 30b overlap, or are merged, leaving small, diamond-shaped dummy silicon pillars 33 between the segmented transistor sections. In this embodiment, a single dummy pillar is centrally located between the four rounded ends of adjacent pairs of transistor segments over the two sections. In the example shown, for every N (where N is an integer greater than 1) racetrack segments or structures in a section 30 of the transistor comprising die 21, there are a total of N−1 dummy pillars 33.

FIG. 4A illustrates yet another example layout of the vertical HVFET structure shown in FIG. 1. FIG. 4B is an expanded view of one portion of the example layout shown in FIG. 4A. Pillars 17 and oxide region 15b are just shown for clarity reasons in the expanded view of FIG. 4B. In this example, the transistor segments comprising the HVFET of semiconductor die 21 are alternately shifted by half of the length of each racetrack segment, resulting in racetrack transistor segments that are alternately associated with upper transistor section 40a and lower transistor section 40b. In other words, each of the transistor segments of a row of section 40a is separated by a pair of the transistor segments of section 40b, the pair being arranged in an end-to-end relationship in the x-direction.

It is appreciated that the alternate shifting of the segments may be any fraction of the segment length. In other words, shifting of the segments is not limited to 50% or half the length. Various embodiments may comprise segments alternately shifted by any percentage or fraction ranging from greater than 0% to less than 100% of the length of the transistor segments.

In the example of FIGS. 4A & 4B, the dielectric regions 15b of alternating ones of the transistor segments in respective sections 40a & 40b are merged. In the specific embodiment shown, the rounded ends of the transistor segments associated with different adjacent sections overlap or are merged such that field plates 19b of the adjacent sections are merged at the ends (in the x-direction). Also, the extended straight side portions of field plates 19b of alternating transistor segments of different sections are merged along a substantial length of each segment. It is appreciated that regions 15b and 19b may be merged with or without a dummy pillar (or isolated dummy silicon pillars) between the respective sections.

Figure 5:
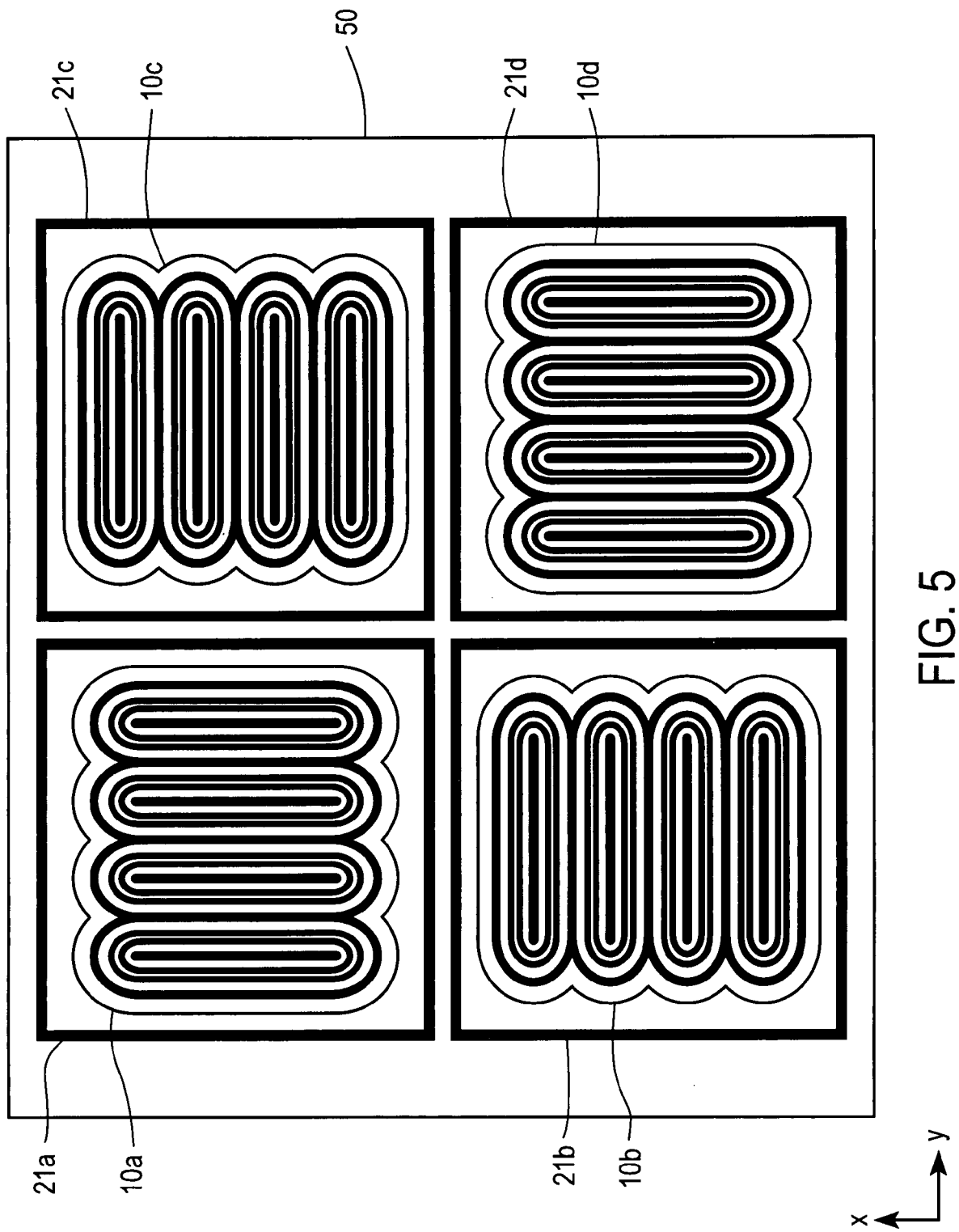
FIG. 5 illustrates an example layout of a wafer with die-to-die checkerboarding of HVFETs.

FIG. 5 illustrates an example layout of a wafer 50 with die-to-die checkerboarding of HVFETs 10a-10d on semiconductor die 21a-21d, respectively. Each of HVFETs 10 comprises a plurality of racetrack-shaped transistor segments such as that shown in FIG. 1, arranged side-by-side along their width into a substantially square block. In this example, HVFETs 10a-10d each comprises transistor segments having a length that extends substantially across the length of the respective die 21a-21d. In one embodiment, the width of each segment is about 13 μm, with the length ranging from about 500 μm to 2000 μm. Other embodiments may have lengths greater than 2000 μm. The block or stacked arrangement of segments also extends substantially across the width of each die. (Note that the bordered square of each die 21 represents the edge of the scribe area between adjacent semiconductor die.) Although FIG. 5 shows two rows and two columns of HVFETs 10 it is appreciated that the die-to-die checkerboarding arrangement shown may be repeated across the entire wafer substrate.

In the example of FIG. 5 adjacent die in a row or a column are oriented such that the length of the transistor segments in one die extends in one direction, with the length of the transistor segments in an adjacent die extending in a second orthogonal direction. For instance, HVFET 10a is shown with the length of its transistor segments oriented in the x-direction, whereas adjacent HVFETs 10b & 10c By orthogonally alternating the orientation of the transistor segments in each individual die 21 across wafer 50 (i.e., checkerboarding) mechanical stress generated by the long dielectric regions is distributed in two orthogonal directions, thus reducing warping of wafer 50.

Figure 6:
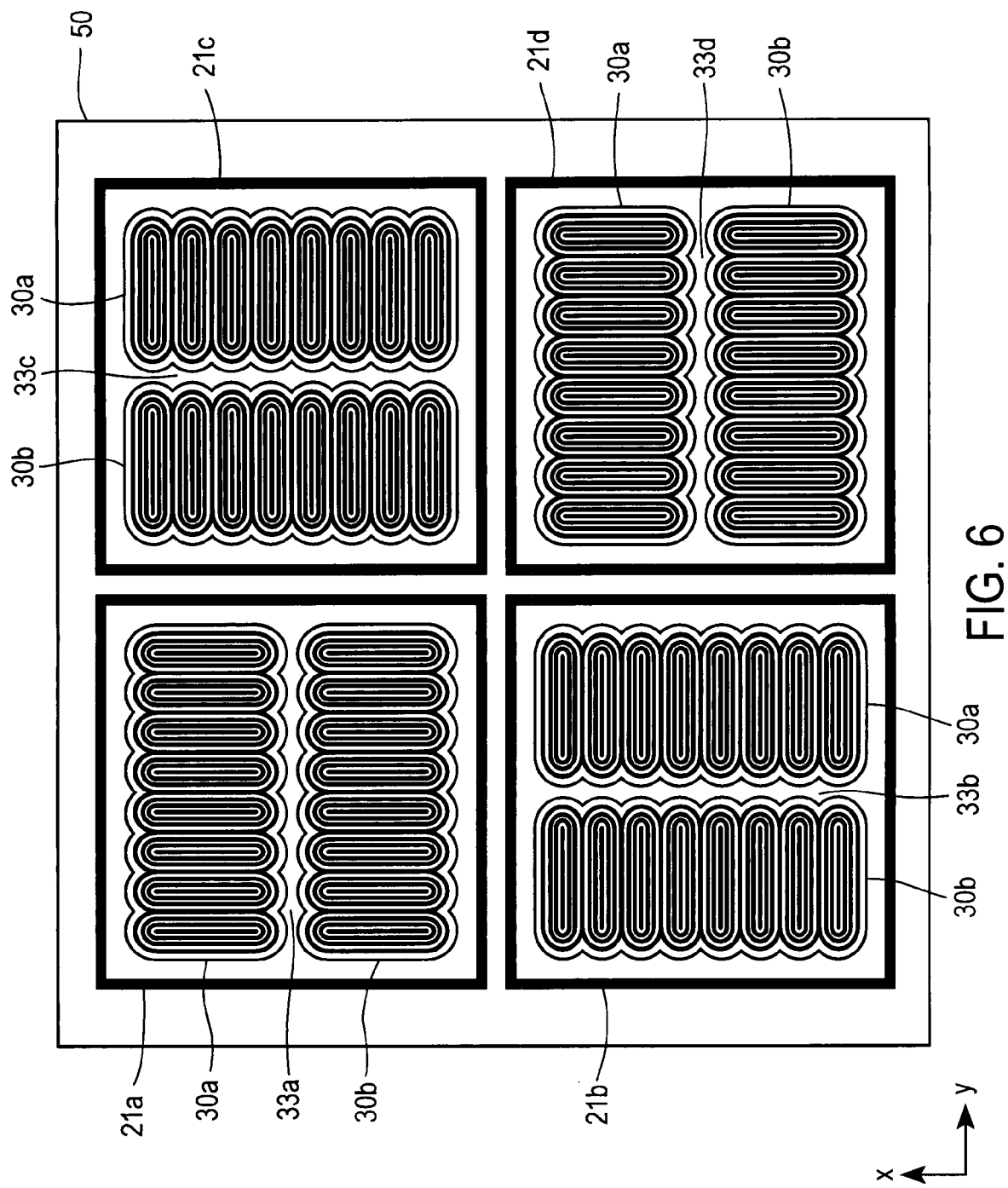
FIG. 6 illustrates an example layout of a wafer with die-to-die checkerboarding of segmented HVFETs.

FIG. 6 illustrates another example layout of a wafer with die-to-die checkerboarding of segmented HVFETs. The example of FIG. 6 utilizes the same approach as in FIG. 5 of alternating the orientation of the transistor structures die-to-die; however, in the embodiment of FIG. 6, the HVFET structures are segmented into multiple (e.g., two) sections. For instance, each HVFET that extends substantially across the length and width of a semiconductor die 21 is segmented into two sections 30a & 30b separated by a dummy pillar 32.

Each of the semiconductor die 21 shown in FIG. 6 has a layout that is the same as that shown in FIG. 2A for a substantially square die. Similar to the example shown in FIG. 5, adjacent die have transistor segments that are orthogonally alternating across wafer 50. That is, the transistor segments in sections 30a & 30b of die 21a and 21d have a length oriented in the x-direction, whereas the transistor segments in sections 30a & 30b of die 21b and 21c have a length oriented in the y-direction.

It is appreciated that the HVFET of each die 21 may be formed with multiple transistor sections, e.g., greater than 2, each separated by one or more dummy pillars. Furthermore, any of the single die layouts with multiple transistor sections shown in the examples of FIGS. 2A-4B may be utilized in each of the die 21 shown in FIG. 6, with the orientation of the segments alternating die-to-die across wafer 50.

Figure 7:
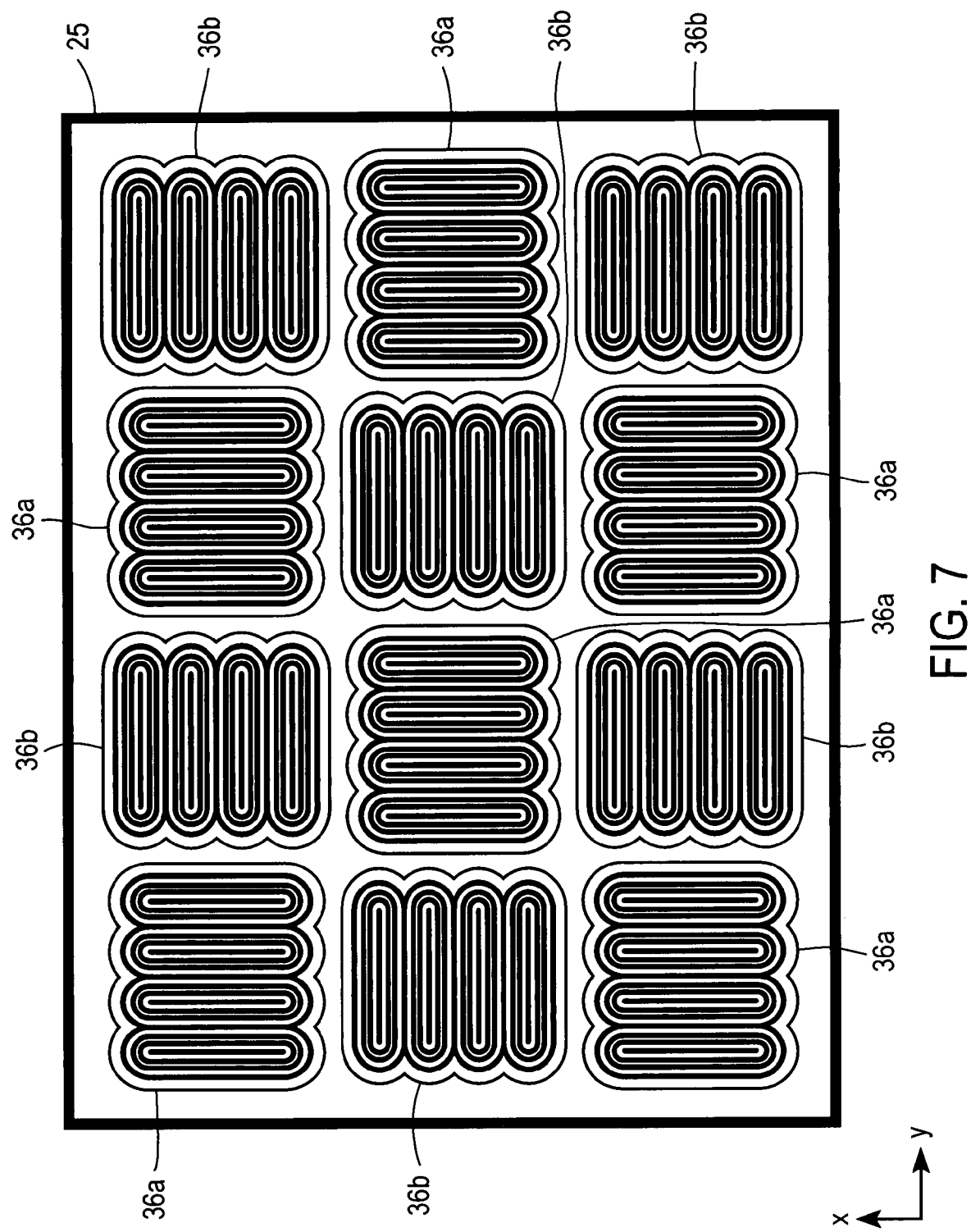
FIG. 7 illustrates an example layout of a rectangular die with checkerboarded blocks of HVFET segments.

FIG. 7 illustrates an example rectangular layout of a die 25 with checkerboarded blocks of racetrack-shaped HVFET segments stacked in a side-by-side arrangement of substantially square blocks or sections 36. Adjacent sections in a row or a column are oriented such that the length of the transistor segments in one section extends in one direction, with the length of the transistor segments in the other adjacent section extending in a second orthogonal direction. For example, each of the rows and columns of die 25 include transistor sections 36a oriented with the elongated transistor segments aligned in the x-direction and alternate transistor sections 36b oriented with the elongated transistor segments aligned in the y-direction. The spaces between sections 36a and 36b comprise dummy silicon pillars; that is, the silicon that forms the dummy pillars is not an active transistor region.

In the embodiment shown, die 25 comprises three rows and four columns of transistor sections 36. The checkerboarded layout approach shown in the example of FIG. 7 may be used to produce a single, discrete HVFET on a die of virtually any (within practical limits) rectilinear-shape.

Figure 8A:
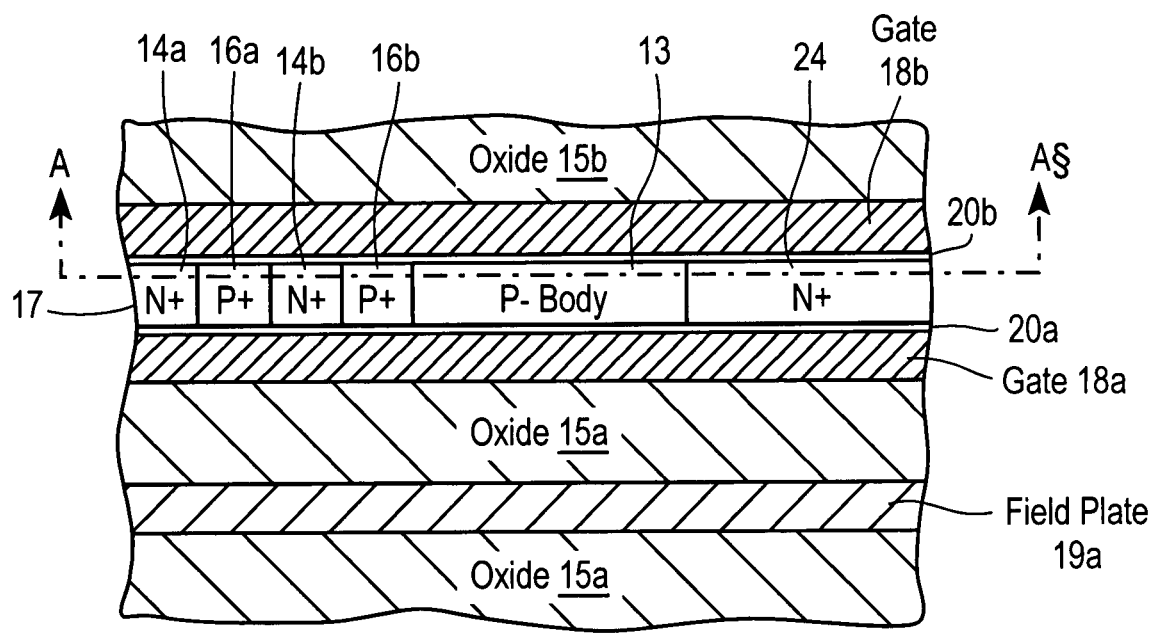
FIG. 8A is a top view of a portion of an example layout of a sensefet incorporated in the vertical HVFET structure shown in FIG. 1.
Figure 8B:
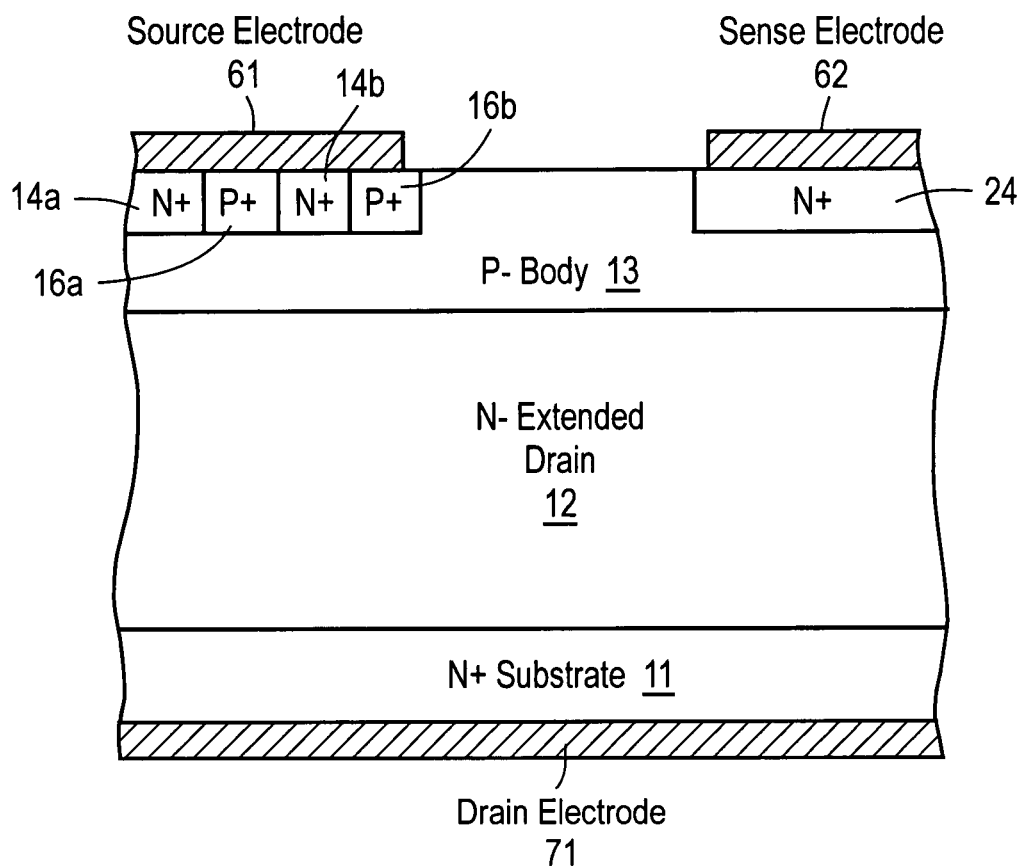
FIG. 8B is a cross-sectional side view taken through cut lines A-A' of the example layout shown in FIG. 8A.
Figure 9:
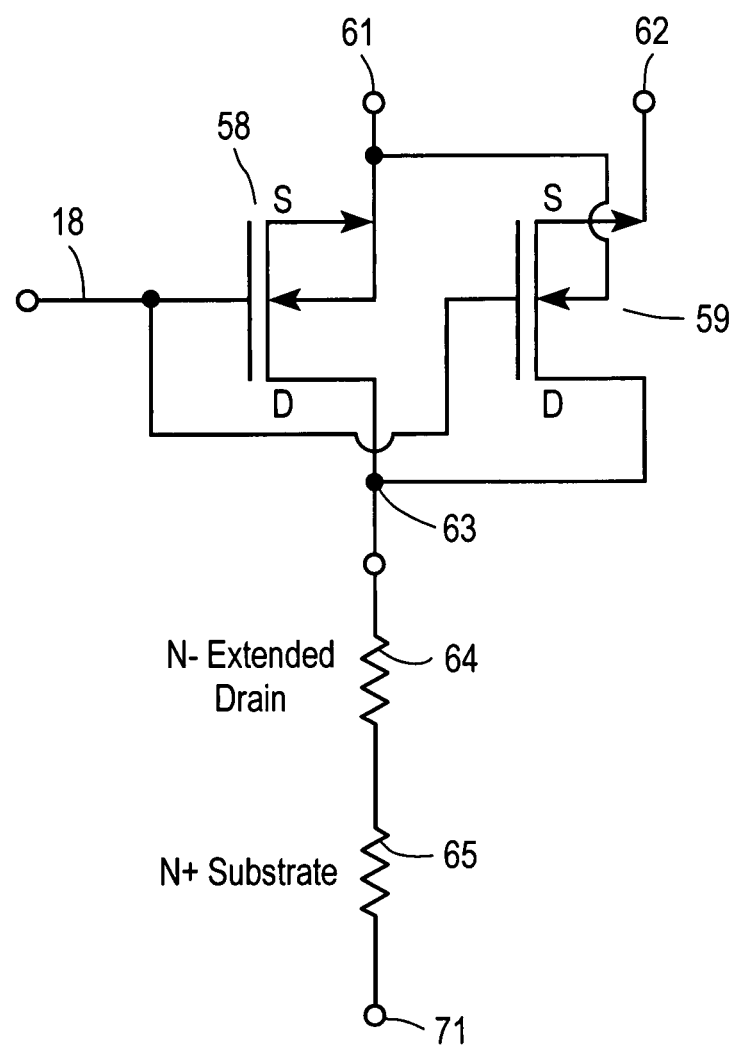
FIG. 9 is an example circuit schematic diagram of the integrated device structure shown in FIGS. 8A & 8B.

FIG. 8A is a top view of a portion of an example layout of a sensefet incorporated in the vertical HVFET structure shown in FIG. 1. In the embodiment shown, the sensefet is integrated into the same silicon pillar 17 as the main vertical power transistor device. FIG. 8B is a cross-sectional side view taken through cut lines A-A' of the example layout shown in FIG. 8A. FIG. 9 is an example circuit schematic diagram of the integrated device structure shown in FIGS. 8A & 8B. Viewed collectively, the top of pillar 17 is seen comprising N+ source regions 14 and P+ regions 16 that alternate along the lateral length of the pillar in a given racetrack shaped transistor segment. For example, from left-to-right, FIGS. 8A & 8B illustrate regions 14a, 16a, 14b, and 16b that comprise the top portion of the vertical HVFET device 58 (see FIG. 9). P-body region 13 extends to the top surface of pillar 17 to the immediate right of region 16b, thereby separating region 16b from N+ region 24, which is associated with the sensefet device 59.

It is appreciated that the other lateral side of N+ region 24 (to the right of the portion shown) is similarly separated from the alternating pattern of respective N+/P+ regions 14 & 16 by an area of P-body region 13 that extends to the surface of pillar 17. In a typical embodiment, region 24 comprises a small portion of the overall transistor segment (pillar) layout, such that sensefet 59 senses a small portion of the current flowing through the main vertical transistor device 58.

In the example of FIGS. 8A & 8B, pillar 17 is flanked on opposite lateral sides by gate members 18a & 18b, which are separated from the top portion of pillar 17 by gate oxide layers 20a & 20b, respectively. Source electrode 61 electrically contacts each of regions 14 & 16, while sense electrode 62 only contacts N+ region 24 of sensefet 59. Source electrode 61 may also electrically connect with the inner and outer field plate members 19a & 19b in certain embodiments.

The circuit schematic diagram of FIG. 9 illustrates that vertical HVFET device 58 and sensefet 59 share a common gate 18 and a common drain node 63. Extended drain region 12 and N+ substrate 11 are shown as series connected resistors 64 and 65, respectively, coupled between node 63 and drain electrode 71, that latter being formed on the bottom surface of substrate 11. In operation, electrode 62 of sensefet 59 may be used to sample a small portion of the current flowing through the much larger vertical transistor device 58, thereby providing an indication of the current flowing through main transistor 58.

Figure 10A:
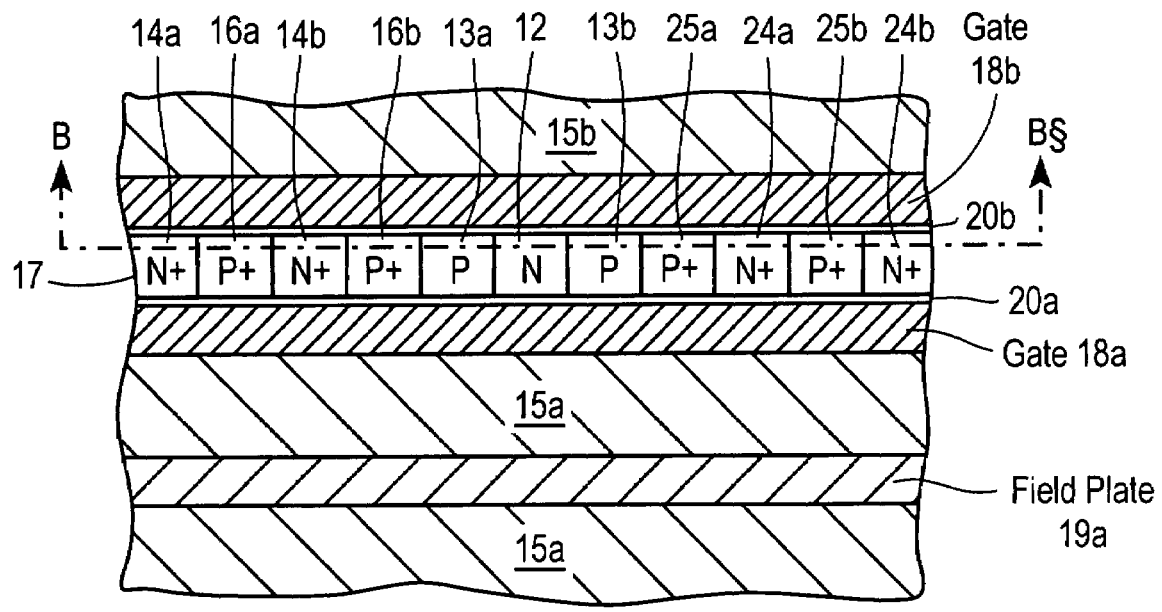
FIG. 10A is a top view of a portion of another example layout of a sensefet incorporated in the vertical HVFET structure shown in FIG. 1.
Figure 10B:
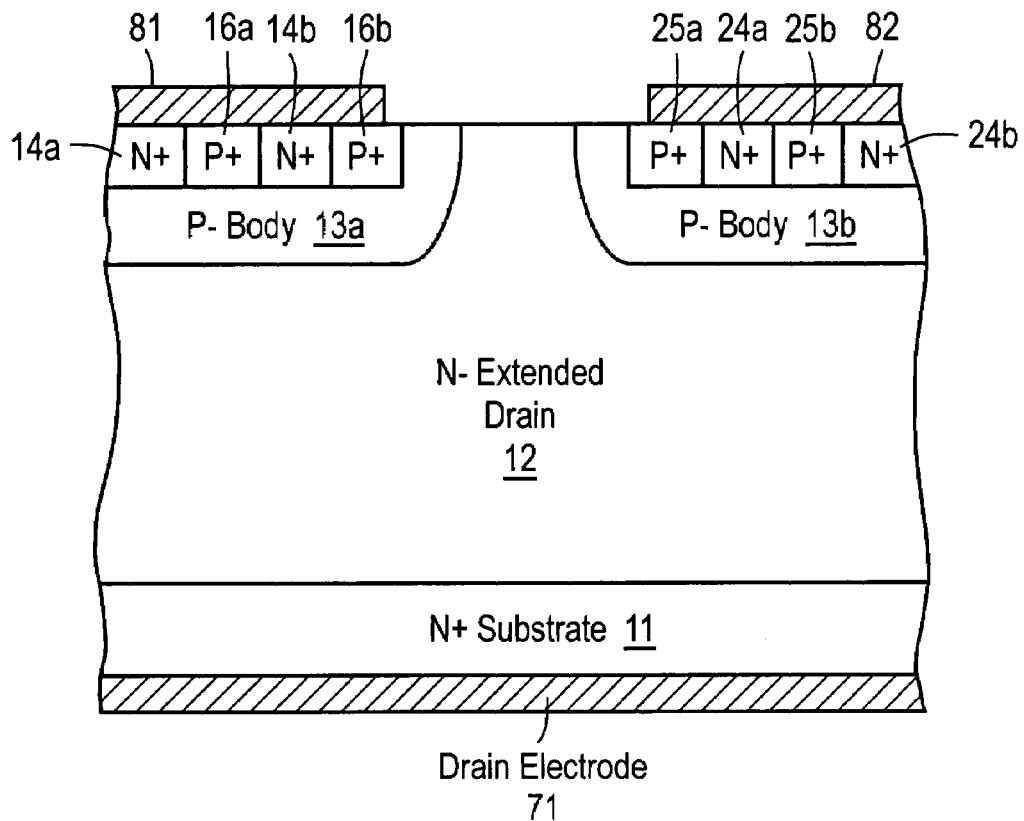
FIG. 10B is a cross-sectional side view taken through cut lines B-B' of the sensefet and HVFET shown in FIG. 10A.
Figure 11:
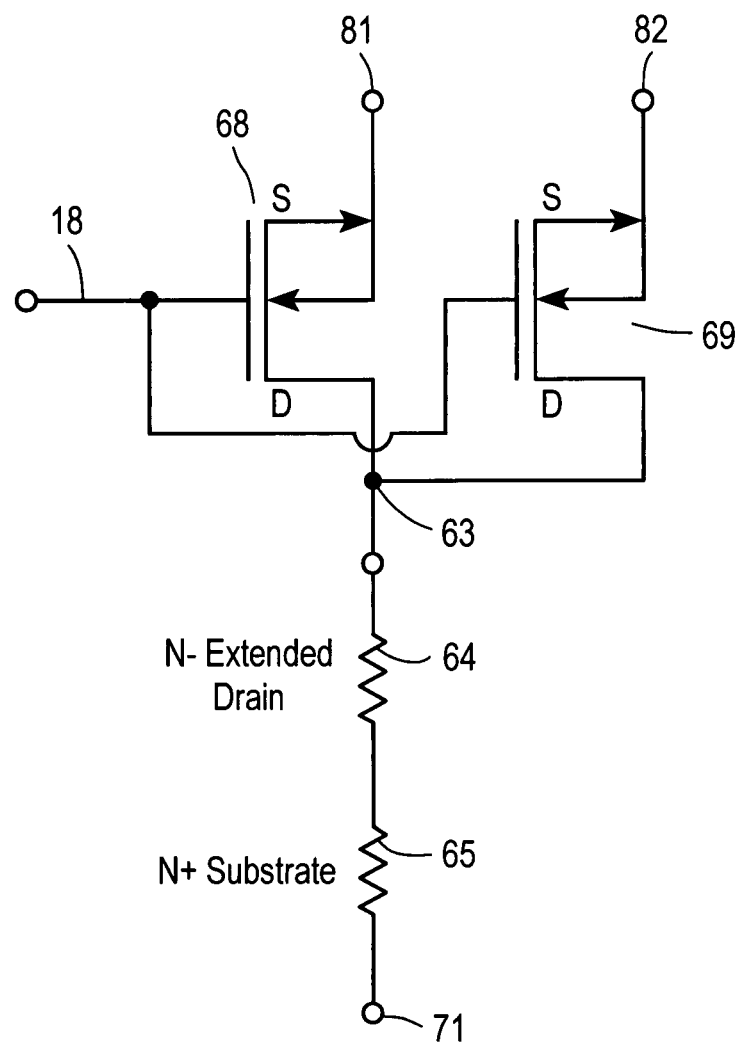
FIG. 11 is an example circuit schematic diagram of the integrated device structure shown in FIGS. 10A & 10B.

FIG. 10A is a top view of a portion of another example layout of a sensefet incorporated in the vertical HVFET structure shown in FIG. 1. FIG. 10B is a cross-sectional side view taken through cut lines B-B' of the sensefet and HVFET shown in FIG. 10A. FIG. 11 is an example circuit schematic diagram of the integrated device structure shown in FIGS. 10A & 10B. Note that the embodiment shown in FIGS. 10A, 10B and 11, sensefet 69 comprises P+ regions 25 and N+ regions 24 that alternate along the lateral length (i.e., around the racetrack shape) of pillar 17. Each of regions 24 & 25 are disposed in a P-body region 13b that is separated from P-body region 13a associated with main vertical transistor 68 by an area of extended drain region 12 that extends to the surface of pillar 17. Each of P-body regions 13a & 13b extend to the surface of the pillar on both lateral sides of the alternating sequence of N+/P+ regions of respective transistors 68 & 69.

In FIG. 11, vertical HVFET device 68 and sensefet 69 are shown sharing a common gate 18 and a common drain node 63. The common extended drain region 64 and N+ substrate 65 are shown as series connected resistors 64 and 65, respectively, coupled between node 63 and drain electrode 71. Source electrode 81 electrically contacts each of regions 14 & 16 of main vertical transistor 68, while sense electrode 82 only contacts regions 24 and 25 of sensefet 69. Source electrode 81 may also electrically connect with the inner and outer field plate members 19a & 19b in the metallization layout.

Figure 12C:
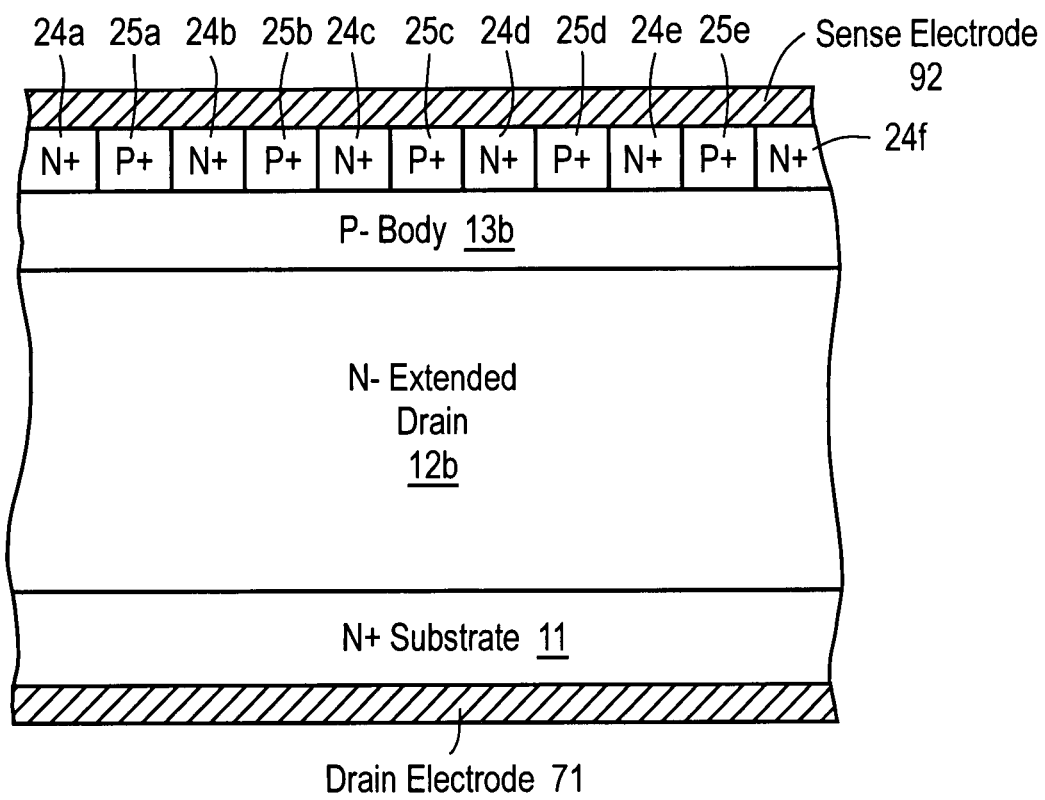
FIG. 12C a cross-sectional side view taken through cut lines D-D' of the device structure shown in FIG. 12A.

FIG. 12A is a top view of a portion of yet another example layout of a sensefet incorporated in the vertical HVFET structure shown in FIG. 1. FIGS. 12B & 12C are cross-sectional side views taken through cut lines C-C' and D-D', respectively, of the device structure shown in FIG. 12A. Note that in this embodiment, the sensefet and main vertical HVFET devices are formed on separate pillars that are isolated from each other. FIG. 12B is a cross-section of main vertical transistor device 78 (associated with pillar 17), whereas FIG. 12C is a cross-section of sensefet 79 (associated with pillar 17'). By way of example, pillar 17' may comprise a single racetrack-shaped transistor segment dedicated to sensefet 79 disposed adjacent to a plurality of other similarly shaped transistor segments dedicated to main vertical transistor device 78. It is appreciated that the main vertical HVFET device comprises a majority of the transistor segments on a die, with the sensefet comprising a minority (e.g., a single one) of the transistor segments.

As shown in FIG. 12B, main vertical transistor device 78 comprises alternating N+ regions 14 and P+ regions 16 disposed at the top of pillar 17. Source electrode 91 electrically contacts each of regions 14 & 16. In the main transistor device 78, P-body region 13a separates regions 14 & 16 from underlying extended drain region 12a. Similarly, FIG. 12C shows sensefet 79 comprising alternating N+ regions 24 and P+ regions 25 disposed at the top of pillar 17'. Sense electrode 92 electrically contacts each of regions 24 & 25. P-body region 13b separates regions 24 & 25 from underlying extended drain region 12b.

Figure 13:
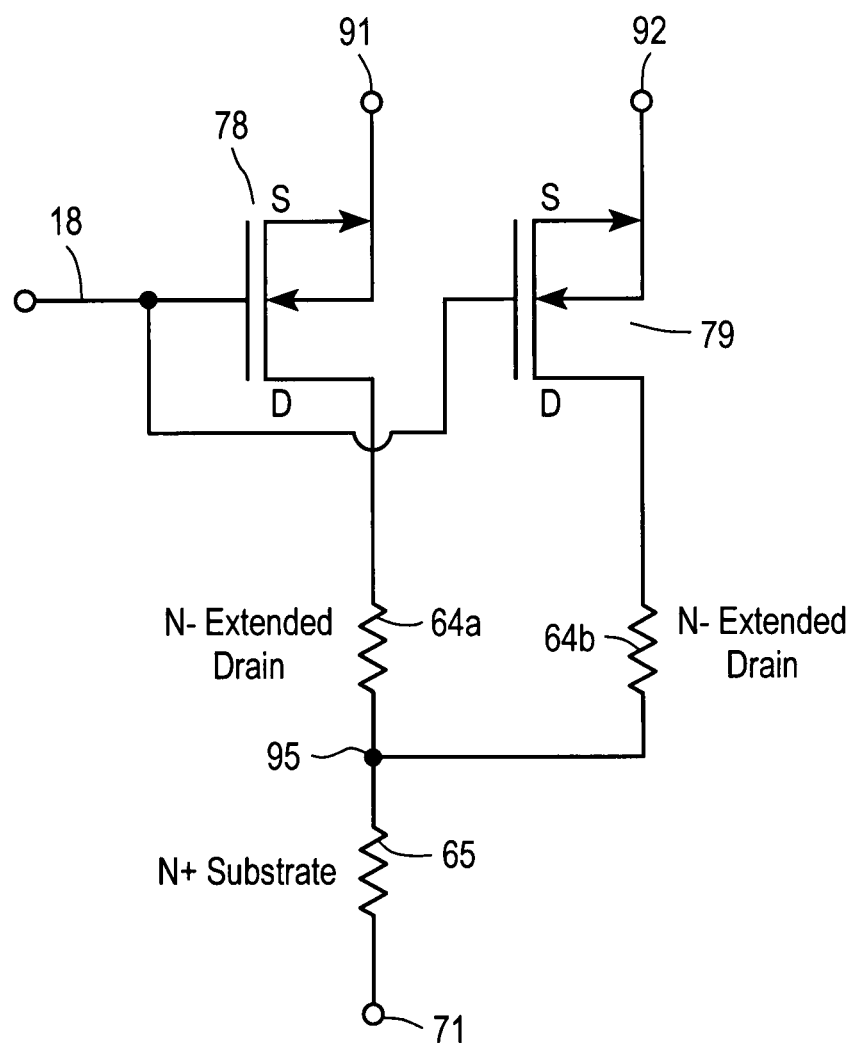
FIG. 13 is an example circuit schematic diagram of the integrated device structure shown in FIGS. 12A-12C.

Note that in the example circuit schematic diagram of FIG. 13, a resistor 65 representing the resistance of N+ substrate 11 is shown between a common node 95 and drain electrode 71. The resistance of extended drain region 12b is shown as resistor 64b connected between the drain of sensefet 79 and node 95. Similarly, the resistance of extended drain region 12a is shown as resistor 64a connected between the drain of main vertical transistor 78 and common node 95. The equivalent circuit diagram of FIG. 13 reflects the fact that even though sensefet 79 and main transistor 78 are formed on separate pillars, each pillar on the semiconductor die shares a common N+ substrate region.

Although the above embodiments have been described in conjunction with a specific device types, those of ordinary skill in the arts will appreciate that numerous modifications and alterations are well within the scope of the present invention. For instance, although HVFETs have been described, the methods, layouts and structures shown are equally applicable to other structures and device types, including Schottky, diode, IGBT and bipolar structures. Accordingly, the specification and drawings are to be regarded in an illustrative rather than a restrictive sense.

We claim:

1. A semiconductor device comprising:
   a main vertical high-voltage field-effect transistor (HVFET) structure; and
   a sensing FET structure integrated laterally adjacent to the HVFET structure,
   the main vertical HVFET structure being formed on a first pillar of semiconductor material, and the sensing FET structure being formed on a second pillar of the semiconductor material, the semiconductor material being formed on a substrate,
   the first and second pillars and the substrate being of a first conductivity type,
   the first and second pillars each having a top surface and a bottom, the bottom adjoining the substrate, the first and second pillars each extending in a vertical direction from the bottom to the top surface,
   the first and second pillars each extending in first and second lateral directions to form a racetrack-shaped layout which includes a pair of substantially parallel, elongated straight sections having a length that extends in the first lateral direction, the pair of straight sections being connected at opposite ends by respective first and second semi-circular sections that span a width of the racetrack-shaped layout in the second lateral direction,
   first and second dielectric regions being disposed on opposite sides of each of the first and second pillars,
   first and second gate members being respectively disposed adjacent each of the first and second pillars in the first and second dielectric regions at or near the top surface,
   the main vertical HVFET structure and the sensing FET structure each having an extended drain region of the first conductivity type, the extended drain of the main vertical HVFET structure being formed in the first pillar above the substrate, and the extended drain of the sensing FET structure being formed in the second pillar above the substrate, the substrate being commonly shared by the main vertical HVFET structure and the sensing FET structure,
   the first and second gate members also being commonly shared by the main vertical HVFET structure and the sensing FET structure;
   the main vertical HVFET structure further including:
      a first body region of a second conductivity type disposed in the first pillar above the extended drain region of the main vertical HVFET structure; and
      a first source region disposed at or near the top surface of the first pillar, the first source region being vertically separated from the extended drain region of the main vertical HVFET structure by the first body region;
   the sensing FET structure further including:
      a second body region of a second conductivity type disposed in the second pillar above the extended drain region of the sensing FET structure; and
      a second source region disposed at or near the top surface of the second pillar, the second source region being vertically separated from the extended drain region of the sensing FET structure by the second body region,
   wherein the sensing FET structure is operable to sample a small portion of a current that flows in the main vertical HVFET structure, thereby providing an indication of a current flowing through the main vertical HVFET structure.

2. The semiconductor device of claim 1 further comprising first and second field plates respectively disposed in the first and second dielectric regions.

3. The semiconductor device of claim 2 further comprising:
   a source electrode that electrically contacts the first source region;
   a sensing source electrode that electrically contacts the second source region; and
   a drain electrode that electrically contacts a bottom surface of the substrate, the drain electrode being commonly shared by the main vertical HVFET structure and the sensing FET structure.

4. The semiconductor device of claim 3 wherein the source electrode is electrically coupled to the first and second field plates.

5. The semiconductor device of claim 1 further comprising first and second regions of the second conductivity type disposed laterally adjoining the first and second source regions, respectively.

6. The semiconductor device of claim 1 wherein the first pillar comprises a transistor segment of the main vertical HVFET structure, the main vertical HVFET structure comprising a plurality of transistor segments length is at least 30 times greater than the width.

7. An integrated circuit (IC) comprising:
   a power field-effect transistor (FET) device structure which comprises a plurality of transistor segments; and
   a sensing FET device structure which comprises a single transistor segment, the single transistor segment and each of the plurality of transistor segments each comprising:
      a pillar formed on a substrate, the pillar and substrate both being of a first conductivity type, the pillar having a top surface and a bottom, the bottom adjoining the substrate, the pillar extending in a vertical direction from the bottom to the top surface, the pillar extending in first and second lateral directions to form a racetrack-shaped layout which includes a pair of substantially parallel, elongated straight sections having a length that extends in the first lateral direction, the pair of straight sections being connected at opposite ends by respective first and second semi-circular sections that span a width of the racetrack-shaped layout in the second lateral direction;
      first and second dielectric regions being disposed on opposite sides of the pillar;
      first and second gate members being respectively disposed adjacent the pillar in the first and second dielectric regions, each of the first and second gate members being insulated from the pillar by a thin layer of dielectric material;

wherein the power FET device structure and the sensing FET device structure share a common electrical connection at the bottom of the pillar adjoining the substrate, the first and second gate members also being commonly shared by the power FET device structure and the sensing FET device structure;

each of the plurality of transistor segments of the power FET device structure further including:
- a first extended drain region of the first conductivity type formed in the pillar of the power FET device structure above the substrate,
- a first body region of a second conductivity type disposed in the pillar of the power FET device structure above the extended drain region; and
- a first source region disposed at or near the top surface of the pillar of the power FET device structure,
- the first source region being vertically separated from the extended drain region by the first body region,
- the first and second gate members being disposed laterally adjacent the first body region and extending vertically from the first source region to the first extended drain region;

the single transistor segment of the sensing FET device structure further including:
- a second extended drain region of the first conductivity type formed in the pillar of the sensing FET device structure above the substrate,
- a second body region of a second conductivity type disposed in the pillar of the sensing FET device structure above the extended drain region; and
- a second source region disposed at or near the top surface of the pillar of the sensing FET device structure,
- the second source region being vertically separated from the extended drain region by the second body region,
- the second source region being laterally separated and electrically isolated in the first lateral direction from the first source region, wherein the sensing FET device structure is operable to sample a small portion of a current that flows in the power FET device structure, thereby providing an indication of a current flowing through the power FET device structure.

8. The IC of claim 7 wherein the single transistor segment and each of the plurality of transistor segments each further comprise:
- first and second field plates respectively disposed in the first and second dielectric regions, the first and second field plates extending vertically from the top surface down to near the substrate,
- the first and second field plates being electrically insulated from the first and second gate members.

9. The IC of claim 7 further comprising:
- a source electrode that electrically contacts the first source region;
- a sensing source electrode that electrically contacts the second source region; and
- a drain electrode that electrically contacts a bottom surface of the substrate, the drain electrode being commonly shared by the power FET device structure and the sensing FET device structure.

10. The IC of claim 9 wherein the source electrode is electrically coupled to the first and second field plates of each of the plurality of transistor segments.

* * * * *